(12) United States Patent
Liu et al.

(10) Patent No.: US 10,504,975 B2
(45) Date of Patent: Dec. 10, 2019

(54) ORGANIC LIGHT-EMITTING DIODE DISPLAY SUBSTRATE, MANUFACTURING METHOD THEREOF AND DISPLAY DEVICE

(71) Applicant: BOE TECHNOLOGY GROUP CO., LTD., Beijing (CN)

(72) Inventors: Wenqu Liu, Beijing (CN); Feng Zhang, Beijing (CN); Zhijun Lv, Beijing (CN); Ning Dang, Beijing (CN); Liwen Dong, Beijing (CN); Shizheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/970,863

(22) Filed: May 3, 2018

(65) Prior Publication Data

US 2019/0035864 A1 Jan. 31, 2019

(30) Foreign Application Priority Data

Jul. 28, 2017 (CN) .......................... 2017 1 0631205

(51) Int. Cl.
| | | |
|---|---|---|
| *H01L 27/32* | (2006.01) | |
| *H01L 51/00* | (2006.01) | |
| *H01L 51/56* | (2006.01) | |
| *G02F 1/1339* | (2006.01) | |
| *G03F 7/32* | (2006.01) | |

(Continued)

(52) U.S. Cl.
CPC ...... *H01L 27/3246* (2013.01); *G02F 1/13394* (2013.01); *H01L 51/0018* (2013.01); *H01L 51/56* (2013.01); *G03F 7/16* (2013.01); *G03F 7/20* (2013.01); *G03F 7/32* (2013.01); *H01L 27/3262* (2013.01); *H01L 2227/323* (2013.01)

(58) Field of Classification Search
CPC .......................... H01L 27/3246; G02F 1/13394
See application file for complete search history.

(56) References Cited

U.S. PATENT DOCUMENTS

| | | | |
|---|---|---|---|
| 2009/0058294 A1* | 3/2009 | Joo | .......................... H05B 33/04 |
| | | | 313/512 |
| 2015/0311473 A1 | 10/2015 | Kim et al. | |

(Continued)

FOREIGN PATENT DOCUMENTS

| | | |
|---|---|---|
| CN | 101800293 A | 8/2010 |
| CN | 103489827 A | 1/2014 |
| CN | 104538558 A | 4/2015 |

OTHER PUBLICATIONS

First Chinese Office Action dated Jul. 4, 2018, for corresponding Chinese Application No. 201710631205.3.

*Primary Examiner* — Farun Lu
(74) *Attorney, Agent, or Firm* — Kinney & Lange, P.A.

(57) ABSTRACT

The present disclosure provides in some embodiments a method for manufacturing an OLED display substrate, including a step of forming a PS on a substrate with an anode and a step of forming a pattern of a pixel definition layer. The step of forming the PS is performed no later than the step of forming the pattern of the pixel definition layer. According to the present disclosure, the PS is able to be formed prior to the formation of the pattern of the pixel definition layer, or the PS and the pattern of the pixel definition layer are formed simultaneously through one single patterning process.

12 Claims, 3 Drawing Sheets

(51) Int. Cl.
*G03F 7/16* (2006.01)
*G03F 7/20* (2006.01)

(56) References Cited

U.S. PATENT DOCUMENTS

2016/0218124 A1 7/2016 Wang et al.
2017/0133446 A1* 5/2017 Hsu ........................ H01L 27/12

* cited by examiner

ORGANIC LIGHT-EMITTING DIODE DISPLAY SUBSTRATE, MANUFACTURING METHOD THEREOF AND DISPLAY DEVICE

CROSS-REFERENCE TO RELATED APPLICATION

The present application claims a priority of the Chinese patent application No. 201710631205.3 filed on Jul. 28, 2017, which is incorporated herein by reference in its entirety.

TECHNICAL FIELD

The present disclosure relates to the field of display technology, in particular to an organic light-emitting diode (OLED) display substrate, a manufacturing method thereof and a display device.

BACKGROUND

Along with the development of the science and technology, visual information and flat-panel display devices capable of receiving and displaying the visual information have played a more and more important role in our lives. As a new-generation display device, an OLED display device has attracted more and more attentions due to such advantages as low power consumption and high contrast.

During the manufacture of an OLED display substrate, an anode of the OLED display substrate is formed at first, and then a pattern of a pixel definition layer is formed on a base substrate with the anode. The pattern of the pixel definition layer is provided with a plurality of openings so as to expose the anode. After the formation of the pattern of the pixel definition layer, it is necessary to form a post spacer (PS) on the pattern of the pixel definition layer. During the formation of the PS, it is necessary to coat an organic photosensitive material onto the base substrate. After an exposing and developing process, the organic photosensitive material may easily remain on the anode, so the performance and the yield of the OLED display substrate may be adversely affected.

SUMMARY

In one aspect, the present disclosure provides in some embodiments a method for manufacturing an organic light-emitting diode display substrate, including a step of forming a post spacer on a substrate with an anode and a step of forming a pattern of a pixel definition layer. The step of forming the post spacer is before the step of forming the pattern of the pixel definition layer, or the step of forming the post spacer and the step of forming the pattern of the pixel definition layer are performed simultaneously.

In a possible embodiment of the present disclosure, the method includes: coating an organic photosensitive material layer onto the substrate with the anode; exposing and developing the organic photosensitive material layer so as to form the post spacer; and coating an insulation material layer onto the substrate with the post spacer, and patterning the insulation material layer so as to form the pattern of the pixel definition layer.

In a possible embodiment of the present disclosure, the method includes: coating an insulation layer onto the substrate with the anode; coating a photoresist onto the insulation layer, and exposing and developing the photoresist so as to form a photoresist fully-reserved region, a photoresist partially-reserved region and a photoresist unreserved region; etching off the insulation layer at the photoresist unreserved region; removing the photoresist at the photoresist partially-reserved region, and etching off a portion of the insulation layer at the photoresist partially-reserved region; and removing the photoresist at the photoresist fully-reserved region to form a pattern of the insulation layer. The pattern of the insulation layer includes a first portion and a second portion protruding from the first portion, the first portion is formed into the pattern of the pixel definition layer, and the second portion is formed into the post spacer.

In a possible embodiment of the present disclosure, subsequent to the step of forming the pattern of the pixel definition layer, the method further includes forming an organic light-emitting layer and a cathode sequentially on the substrate with the pattern of the pixel definition layer.

In a possible embodiment of the present disclosure, a cross section of the post spacer is of a quadrilateral shape.

In a possible embodiment of the present disclosure, a cross section of the post spacer is of a trapezoidal shape.

In a possible embodiment of the present disclosure, a cross section of the post spacer is of an isosceles trapezoidal shape.

In a possible embodiment of the present disclosure, the pattern of the pixel definition layer fully covers the post spacer.

In a possible embodiment of the present disclosure, the pattern of the pixel definition layer and the post spacer are formed into one piece.

In a possible embodiment of the present disclosure, a cross section of the first portion is of a rectangular shape.

In a possible embodiment of the present disclosure, a cross section of the second portion is of a trapezoidal shape.

In a possible embodiment of the present disclosure, a cross section of the second portion is of an isosceles trapezoidal shape.

In a possible embodiment of the present disclosure, no organic photosensitive material layer remains at a pixel region corresponding to the anode after the formation of the pattern of the pixel definition layer through patterning the insulation material layer.

In another aspect, the present disclosure provides in some embodiments an OLED display substrate manufactured using the above-mentioned method.

In a possible embodiment of the present disclosure, the OLED display substrate includes: a base substrate; a thin film transistor (TFT) array layer arranged on the base substrate; an anode arranged on the base substrate with the TFT array layer; a post spacer arranged on the base substrate with the anode; a pattern of a pixel definition layer arranged on the base substrate with the post spacer and covering the post spacer; and an organic light-emitting layer and a cathode arranged on the base substrate with the pattern of the pixel definition layer.

In a possible embodiment of the present disclosure, the OLED display substrate includes: a base substrate; a TFT array layer arranged on the base substrate; an anode arranged on the base substrate with the TFT array layer; a pattern of an insulation layer arranged on the base substrate with the anode, the pattern of the insulation layer including a first portion and a second portion protruded from the first portion, the first portion being the pattern of the pixel definition layer and the second portion being the post spacer; and an organic light-emitting layer and a cathode arranged on the base substrate with the pattern of the insulation layer.

In yet another aspect, the present disclosure provides in some embodiments a display device including the above-mentioned OLED display substrate.

Figure 1:
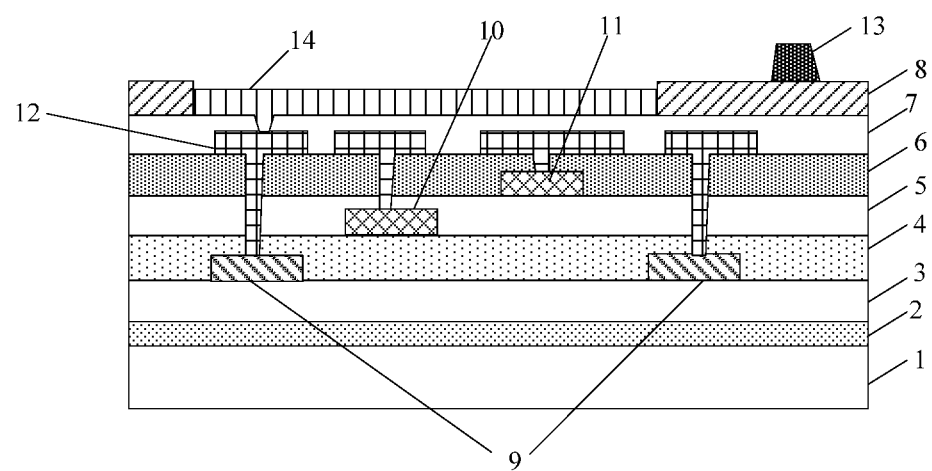
FIG. 1 is a schematic view showing a conventional OLED display substrate.

REFERENCE SIGN LIST 1 rigid substrate
2 flexible substrate
3 buffer layer
4 first gate insulation layer
5 second gate insulation layer
6 intermediate insulation layer
7 planarization layer
8 pixel definition layer
9 active layer
10 first gate electrode
11 second gate electrode
12 source/drain metal layer
13 post spacer (PS)
14 anode
15 pixel region
16 organic photosensitive material

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 2:
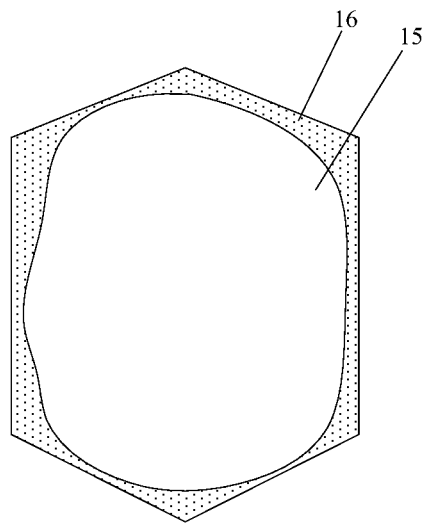
FIG. 2 is a schematic view showing a pixel region of the conventional OLED display substrate where an organic photosensitive material remains.

During the manufacture of an OLED display substrate, as shown in FIG. 1, an anode 14 of the OLED display substrate is formed at first, and then a pattern of a pixel definition layer 8 is formed on a base substrate with the anode 14. The pattern of the pixel definition layer 8 is provided with a plurality of openings so as to expose the anode. After the formation of the pattern of the pixel definition layer 8, it is necessary to form a PS 13 on the pattern of the pixel definition layer 8. During the formation of the PS 13, it is necessary to coat an organic photosensitive material 16 onto the base substrate, and at this time, the organic photosensitive material may also be coated onto the anode 14. The anode 14 is located within the opening of the pixel definition layer 8, i.e., within a structure like a hole. After an exposing and developing process, as shown in FIG. 2, the organic photosensitive material 16 may easily remain on the anode 14 corresponding to a pixel region 15, so the performance and the yield of the OLED display substrate may be adversely affected to some extent.

In addition, in the case that the remaining organic photosensitive material is to be removed, an additional ashing process needs to be performed. Hence, the manufacture process of the OLED display substrate may become more complex and the manufacture cost thereof may increase.

An object of the present disclosure is to provide an OLED display substrate, a manufacturing method thereof and a display device, so as to prevent the organic photosensitive material from remaining on the anode, thereby to improve the yield of the OLED display substrate.

The present disclosure provides in some embodiments a method for manufacturing an OLED display substrate, including a step of forming a PS on a substrate with an anode and a step of forming a pattern of a pixel definition layer. The step of forming the PS is performed no later than the step of forming the pattern of the pixel definition layer.

According to the method in the embodiments of the present disclosure, the step of forming the PS is performed no later than the step of forming the pattern of the pixel definition layer, so the PS may be formed prior to the formation of the pattern of the pixel definition layer, or the PS and the pattern of the pixel definition layer may be formed simultaneously through one single patterning process. As a result, it is unnecessary to coat an organic photosensitive material onto the substrate after the formation of the pattern of the pixel definition layer, so as to prevent the organic photosensitive material from remaining on the anode, thereby to improve the yield of the OLED display substrate.

In a possible embodiment of the present disclosure, the step of forming the PS is performed prior to the step of forming the pattern of the pixel definition layer.

In a possible embodiment of the present disclosure, the method includes: coating an organic photosensitive material layer onto the substrate with the anode; exposing and developing the organic photosensitive material so as to form the PS; and coating an insulation material layer onto the substrate with the PS, and patterning the insulation layer material so as to form the pattern of the pixel definition layer.

In a possible embodiment of the present disclosure, the PS and the pattern of the pixel definition layer are formed simultaneously through one single patterning process.

In a possible embodiment of the present disclosure, the method includes: coating an insulation layer onto the substrate with the anode; coating a photoresist onto the insulation layer, and exposed and developing the photoresist so as to form a photoresist fully-reserved region, a photoresist partially-reserved region and a photoresist unreserved region; etching off the insulation layer at the photoresist unreserved region; removing the photoresist at the photoresist partially-reserved region and etching off a portion of the insulation layer at the photoresist partially-reserved region; and removing the photoresist at the photoresist fully-reserved region, so as to form a pattern of the insulation layer, the pattern of the insulation layer including a first portion and a second portion protruding from the first portion, the first portion being the pattern of the pixel definition layer, and the second portion being the PS.

In a possible embodiment of the present disclosure, subsequent to the step of forming the pattern of the pixel definition layer, the method further includes forming an organic light-emitting layer and a cathode sequentially on the substrate with the pattern of the pixel definition layer.

The present disclosure further provides in some embodiments an OLED display substrate manufactured using the above-mentioned method.

In a possible embodiment of the present disclosure, the OLED display substrate includes: a base substrate; a thin film transistor (TFT) array layer arranged on the base substrate; an anode arranged on the base substrate with the TFT array layer; a PS arranged on the base substrate with the anode; a pattern of a pixel definition layer arranged on the base substrate with the PS and covering the PS; and an organic light-emitting layer and a cathode arranged on the base substrate with the pattern of the pixel definition layer.

In another possible embodiment of the present disclosure, the OLED display substrate includes: a base substrate; a TFT array layer arranged on the base substrate; an anode arranged on the base substrate with the TFT array layer; a pattern of an insulation layer arranged on the base substrate with the anode, the pattern of the insulation layer including a first portion and a second portion protruded from the first portion, the first portion being the pattern of the pixel definition layer and the second portion being the PS; and an organic light-emitting layer and a cathode arranged on the base substrate with the pattern of the insulation layer.

The OLED display substrate and the manufacturing method thereof will be described hereinafter in more details in conjunction with the drawings and embodiments.

First Embodiment

In this embodiment, the PS is formed prior to the pattern of the pixel definition layer. The method may include the following steps.

Step 1: providing a rigid substrate 1. To be specific, the rigid substrate 1 may be a glass substrate or quartz substrate.

Step 2: forming a flexible substrate 2 on the rigid substrate 1. To be specific, the flexible substrate 2 may be made of polyimide.

Step 3: forming a buffer layer 3 on the flexible substrate 2. To be specific, the buffer layer 3 may be made of an oxide, a nitride or an oxynitride.

Step 4: forming a pattern of an active layer 9 on the buffer layer 3. To be specific, a semiconductor material layer may be deposited onto the buffer layer 3, and a photoresist may be coated onto the semiconductor material layer and then exposed with a mask plate so as to form a photoresist reserved region corresponding to a region where the pattern of the active layer 9 is located and a photoresist unreserved region corresponding to the other region. Next, the photoresist may be developed, so as to fully remove the photoresist at the photoresist unreserved region. Next, the semiconductor material layer at the photoresist unreserved region may be etched off through an etching process, so as to form the pattern of the active layer 9. Finally, the photoresist at the photoresist reserved region may be removed.

Step 5: forming a first gate insulation layer 4. To be specific, the first gate insulation layer 4 may be made of an oxide, a nitride or an oxynitride, with corresponding reaction gases of $SiH_4$, $NH_3$ and $N_2$, or $SiH_2Cl_2$, $NH_3$ and $N_2$.

Step 6: forming a pattern of a first gate electrode 10 on the first gate insulation layer 4. To be specific, a gate metal layer having a thickness of 500 to 4000 Å may be deposited onto the first gate insulation layer 4 through sputtering or thermal evaporation. The gate metal layer may be made of copper (Cu), aluminium (Al), argentum (Ag), molybdenum (Mo), chromium (Cr), neodymium (Nd), nickel (Ni), manganese (Mn), titanium (Ti), tantalum (Ta), tungsten (W) or an alloy thereof, and it may be of a single-layered structure or a multi-layered structure such as Cu\Mo, Ti\Cu\Ti or Mo\Al\Mo. Next, a photoresist may be coated onto the gate metal layer, and exposed with a mask plate, so as to form a photoresist reserved region corresponding to a region where the pattern of the first gate electrode 10 is located and a photoresist unreserved region corresponding to the other region. Next, the photoresist may be developed, so as to fully remove the photoresist at the photoresist unreserved region and maintain a thickness of the photoresist at the photoresist reserved region. Finally, the gate metal film at the photoresist unreserved region maybe etched off through an etching process, and the remaining photoresist may be removed, so as to form the pattern of the first gate electrode 10.

Step 7: forming a second gate insulation layer 5. To be specific, the second gate insulation layer 5 may be made of an oxide, a nitride or an oxynitride, with corresponding reaction gases of $SiH_4$, $NH_3$ and $N_2$, or $SiH_2Cl_2$, $NH_3$ and $N_2$.

Step 8: forming a pattern of a second gate electrode 11 on the second gate insulation layer 5. To be specific, a gate metal layer having a thickness of 500 to 4000 Å may be deposited onto the second gate insulation layer 5 through sputtering or thermal evaporation. The gate metal layer may be made of Cu, Al, Ag, Mo, Cr, Nd, Ni, Mn, Ti, Ta, W or an alloy thereof, and it may be of a single-layered structure or a multi-layered structure such as Cu\Mo, Ti\Cu\Ti or Mo\Al\Mo. Next, a photoresist may be coated onto the gate metal layer, and exposed with a mask plate, so as to form a photoresist reserved region corresponding to a region where the pattern of the second gate electrode 11 is located and a photoresist unreserved region corresponding to the other region. Next, the photoresist may be developed, so as to fully remove the photoresist at the photoresist unreserved region and maintain a thickness of the photoresist at the photoresist reserved region. Finally, the gate metal layer at the photoresist unreserved region may be etched off through an etching process, and the remaining photoresist may be removed, so as to form the pattern of the second gate electrode 11. In this embodiment, a driving TFT is provided with two gates (i.e., the first gate electrode 10 and the second gate electrode 11). Of course, the driving TFT may also be provided with merely one gate electrode.

Step 9: forming an intermediate insulation layer 6. To be specific, the intermediate insulation layer 6 may be made of an oxide, a nitride or an oxynitride, with corresponding reaction gases of $SiH_4$, $NH_3$ and $N_2$, or $SiH_2Cl_2$, $NH_3$ and $N_2$.

Step 10: forming a pattern of a source/drain metal layer 12 on the intermediate insulation layer 6. To be specific, the source/drain metal layer 12 having a thickness of about 2000 to 4000 Å may be deposited onto the intermediate insulation layer 6 through magnetron-sputtering, thermal evaporation or any other film-forming method. The source/drain metal layer 12 may be made of Cu, Al, Ag, Mo, Cr, Nd, Ni, Mn, Ti, Ta, W or an alloy thereof, and it may be of a single-layered structure or a multi-layered structure such as Cu\Mo, Ti\Cu\Ti or Mo\Al\Mo. Next, a photoresist may be coated onto the source/drain metal layer 12, and exposed with a mask plate so as to form a photoresist reserved region corresponding to a region where the pattern of the source/drain metal layer 12 is located and a photoresist unreserved region corresponding to the other region. Next, the photoresist may be developed, so as to fully remove the photoresist at the photoresist unreserved region and maintain a thickness of the photoresist at the photoresist reserved region. Finally, the source/drain metal layer 12 at the photoresist unreserved region may be etched off through an etching process, and the remaining photoresist may be removed, so as to form the pattern of the source/drain metal layer 12. The pattern of the source/drain metal layer 12 includes a drain electrode, a source electrode and a data line. The source electrode and the drain electrode are connected to the active layer 9 through via-holes penetrating through the intermediate insulation layer 6, the second gate insulation layer 5 and the first gate insulation layer 4.

Step 11: forming a pattern of a planarization layer 7. To be specific, the planarization layer 7 may be made of organic resin.

Step 12: forming a pattern of an anode 14. To be specific, a transparent conductive layer having a thickness of about 300 to 1500 Å may be deposited onto the planarization layer 7 through sputtering or thermal evaporation. The transparent conductive layer may be made of indium tin oxide (ITO), indium zinc oxide (IZO) or any other transparent metal oxide. Next, a photoresist may be coated onto the transparent conductive layer, and exposed with a mask plate so as to form a photoresist reserved region corresponding to a region where the anode 14 is located and a photoresist unreserved region corresponding to the other region. Next, the photoresist may be developed, so as to fully remove the photoresist at the photoresist unreserved region and maintain a thickness of the photoresist at the photoresist reserved region. Finally, the transparent conductive layer at the photoresist unreserved region may be etched off through an etching process, and the remaining photoresist may be removed, so as to form the pattern of the anode 14.

Figure 6:
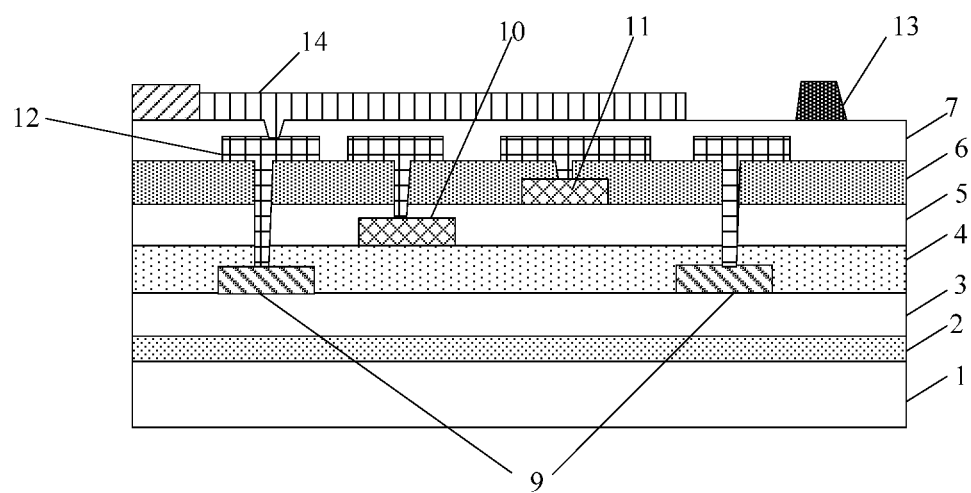
FIG. 6 is a schematic view showing the OLED display substrate acquired after Step 13 according to the first embodiment of the present disclosure.

Step 13: forming a pattern of a PS 13. To be specific, an organic photosensitive material layer may be coated onto the flexible substrate acquired after Step 12, and then exposed and developed so as to form an organic photosensitive material reserved region and an organic photosensitive material unreserved region. The organic photoresist material layer at the organic photosensitive material reserved region may form the PS 13. As shown in FIG. 6, the pattern of the PS 13 has been formed but the pattern of the pixel definition layer 8 has not been formed yet. In other words, the PS 13 is formed prior to the formation of the pattern of the pixel definition layer 8. In this regard, it is unnecessary to coat the organic photosensitive material onto the substrate after the formation of the pattern of the pixel definition layer 8.

Step 14: forming a pattern of a pixel definition layer 8. To be specific, an insulation material layer may be coated onto the flexible substrate acquired after Step 13. Next, a photoresist may be coated onto the insulation material layer, and exposed with a mask plate so as to form a photoresist reserved region corresponding to a region where the pattern of the pixel definition layer 8 is located and a photoresist unreserved region corresponding to the other region. Next, the photoresist may be developed, so as to fully remove the photoresist at the photoresist unreserved region and maintain a thickness of the photoresist at the photoresist reserved region. Finally, the insulation material layer at the photoresist unreserved region may be etched off through an etching process, and the remaining photoresist may be removed, so as to form the pattern of the pixel definition layer 8.

Figure 3:
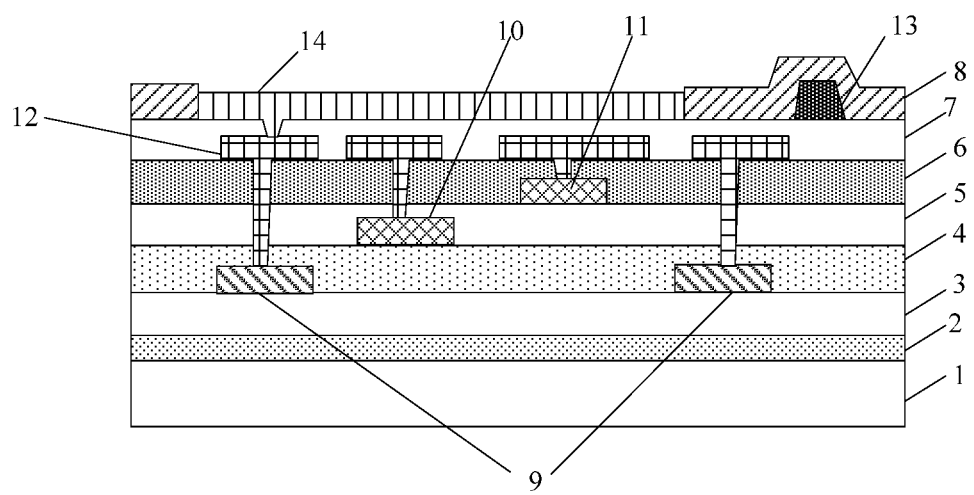
FIG. 3 is a schematic view showing an OLED display substrate according to a first embodiment of the present disclosure.
Figure 5:
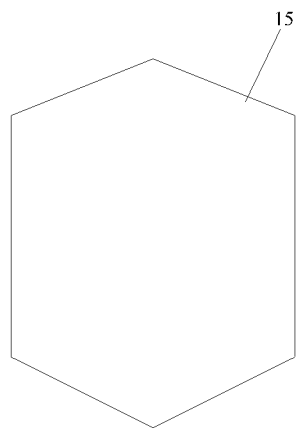
FIG. 5 is a schematic view showing a pixel region of the OLED display substrate where no organic photosensitive material remains according to one embodiment of the present disclosure.

The OLED display substrate in FIG. 3 may be acquired through the above Steps 1 to 14. Subsequently, an organic light-emitting layer and a cathode may be formed on the OLED display substrate. According to the method in the first embodiment of the present disclosure, the PS is formed prior to the formation of the pattern of the pixel definition layer, so it is unnecessary to coat the organic photosensitive material onto the substrate after the formation of the pattern of the pixel definition layer. As shown in FIG. 5, it is able to prevent the organic photosensitive material from remaining on the anode at a pixel region 15, thereby to improve the yield of the OLED display substrate.

Second Embodiment

In this embodiment, the PS and the pattern of the pixel definition layer are formed simultaneously through one single patterning process. The method may include the following steps.

Step 1: providing the rigid substrate 1. To be specific, the rigid substrate 1 may be a glass substrate or quartz substrate.

Step 2: forming the flexible substrate 2 on the rigid substrate 1. To be specific, the flexible substrate 2 may be made of polyimide.

Step 3: forming the buffer layer 3 on the flexible substrate 2. To be specific, the buffer layer 3 may be made of an oxide, a nitride or an oxynitride.

Step 4: forming the pattern of the active layer 9 on the buffer layer 3. To be specific, a semiconductor material layer may be deposited onto the buffer layer 3, and a photoresist may be coated onto the semiconductor material layer and then exposed with a mask plate so as to form a photoresist reserved region corresponding to a region where the pattern of the active layer 9 is located and a photoresist unreserved region corresponding to the other region. Next, the photoresist may be developed, so as to fully remove the photoresist at the photoresist unreserved region. Next, the semiconductor material layer at the photoresist unreserved region may be etched off through an etching process, so as to form the pattern of the active layer 9. Finally, the photoresist at the photoresist reserved region may be removed.

Step 5: forming the first gate insulation layer 4. To be specific, the first gate insulation layer 4 may be made of an oxide, a nitride or an oxynitride, with corresponding reaction gases of $SiH_4$, $NH_3$ and $N_2$, or $SiH_2Cl_2$, $NH_3$ and $N_2$.

Step 6: forming the pattern of the first gate electrode 10 on the first gate insulation layer 4. To be specific, a gate metal layer having a thickness of 500 to 4000 Å may be deposited onto the first gate insulation layer 4 through sputtering or thermal evaporation. The gate metal layer may be made of Cu, Al, Ag, Mo, Cr, Nd, Ni, Mn, Ti, Ta, W or an alloy thereof, and it may be of a single-layered structure or a multi-layered structure such as Cu\Mo, Ti\Cu\Ti or Mo\Al\Mo. Next, a photoresist may be coated onto the gate metal layer, and exposed with a mask plate, so as to form a photoresist reserved region corresponding to a region where the pattern of the first gate electrode 10 is located and a photoresist unreserved region corresponding to the other region. Next, the photoresist may be developed, so as to fully remove the photoresist at the photoresist unreserved region and maintain a thickness of the photoresist at the photoresist reserved region. Finally, the gate metal layer at the photoresist unreserved region maybe etched off through an etching process, and the remaining photoresist may be removed, so as to form the pattern of the first gate electrode 10.

Step 7: forming the second gate insulation layer 5. To be specific, the second gate insulation layer 5 may be made of an oxide, a nitride or an oxynitride, with corresponding reaction gases of $SiH_4$, $NH_3$ and $N_2$, or $SiH_2Cl_2$, $NH_3$ and $N_2$.

Step 8: forming the pattern of the second gate electrode 11 on the second gate insulation layer 5. To be specific, a gate metal layer having a thickness of 500 to 4000 Å may be deposited onto the second gate insulation layer 5 through sputtering or thermal evaporation. The gate metal layer may be made of Cu, Al, Ag, Mo, Cr, Nd, Ni, Mn, Ti, Ta, W or an alloy thereof, and it may be of a single-layered structure or a multi-layered structure such as Cu\Mo, Ti\Cu\Ti or Mo\Al\Mo. Next, a photoresist may be coated onto the gate metal layer, and exposed with a mask plate, so as to form a photoresist reserved region corresponding to a region where the pattern of the second gate electrode 11 is located and a photoresist unreserved region corresponding to the other region. Next, the photoresist may be developed, so as to fully remove the photoresist at the photoresist unreserved region and maintain a thickness of the photoresist at the photoresist reserved region. Finally, the gate metal layer at the photoresist unreserved region maybe etched off through an etching process, and the remaining photoresist may be removed, so as to form the pattern of the second gate electrode 11. In this embodiment, a driving TFT is provided with two gates (i.e., the first gate electrode 10 and the second gate electrode 11). Of course, the driving TFT may also be provided with merely one gate electrode.

Step 9: forming the intermediate insulation layer 6. To be specific, the intermediate insulation layer 6 may be made of an oxide, a nitride or an oxynitride, with corresponding reaction gases of $SiH_4$, $NH_3$ and $N_2$, or $SiH_2Cl_2$, $NH_3$ and $N_2$.

Step 10: forming the pattern of the source/drain metal layer 12 on the intermediate insulation layer 6. To be specific, the source/drain metal layer 12 having a thickness of about 2000 to 4000 Å may be deposited onto the intermediate insulation layer 6 through magnetron-sputtering, thermal evaporation or any other film-forming method. The source/drain metal layer 12 may be made of Cu, Al, Ag, Mo, Cr, Nd, Ni, Mn, Ti, Ta, W or an alloy thereof, and it may be of a single-layered structure or a multi-layered structure such as Cu\Mo, Ti\Cu\Ti or Mo\Al\Mo. Next, a photoresist may be coated onto the source/drain metal layer 12, and exposed with a mask plate so as to form a photoresist reserved region corresponding to a region where the pattern of the source/drain metal layer 12 is located and a photoresist unreserved region corresponding to the other region. Next, the photoresist may be developed, so as to fully remove the photoresist at the photoresist unreserved region and maintain a thickness of the photoresist at the photoresist reserved region. Finally, the source/drain metal layer 12 at the photoresist unreserved region may be etched off through an etching process, and the remaining photoresist may be removed, so as to form the pattern of the source/drain metal layer 12. The pattern of the source/drain metal layer 12 includes a drain electrode, a source electrode and a data line. The source electrode and the drain electrode are connected to the active layer 9 through via-holes penetrating through the intermediate insulation layer 6, the second gate insulation layer 5 and the first gate insulation layer 4.

Step 11: forming the pattern of the planarization layer 7. To be specific, the planarization layer 7 may be made of organic resin.

Step 12: forming the pattern of the anode 14. To be specific, a transparent conductive layer having a thickness of about 300 to 1500 Å may be deposited onto the planarization layer 7 through sputtering or thermal evaporation. The transparent conductive layer may be made of ITO, IZO or any other transparent metal oxide. Next, a photoresist may be coated onto the transparent conductive layer, and exposed with a mask plate so as to form a photoresist reserved region corresponding to a region where the anode 14 is located and a photoresist unreserved region corresponding to the other region. Next, the photoresist may be developed, so as to fully remove the photoresist at the photoresist unreserved region and maintain a thickness of the photoresist at the photoresist reserved region. Finally, the transparent conductive layer at the photoresist unreserved region may be etched off through an etching process, and the remaining photoresist may be removed, so as to form the pattern of the anode 14.

Step 13: forming the PS 13 and the pattern of the pixel definition layer 8. To be specific, an insulation layer may be coating onto the flexible substrate acquired after Step 12. Next, a photoresist may be coated onto the insulation layer, and exposed and developed so as to form a photoresist fully-reserved region, a photoresist partially-reserved region and a photoresist unreserved region. Next, the insulation layer at the photoresist unreserved region may be etched off, and a portion of the photoresist at the photoresist partially-reserved region may be etched off. Finally, the photoresist at the photoresist fully-reserved region may be removed, so as to form a pattern of the insulation layer. The pattern of the insulation layer may include a first portion and a second portion protruding from the first portion. The first portion may form the pattern of the pixel definition layer 8, and the second portion may form the PS 13.

Figure 4:
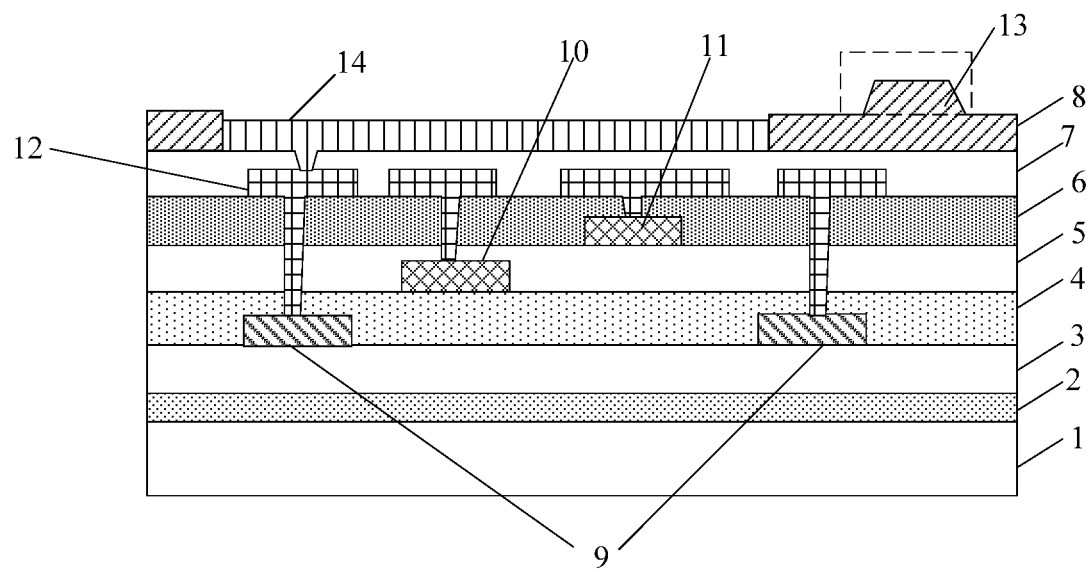
FIG. 4 is another schematic view showing the OLED display substrate according to a second embodiment of the present disclosure.

The OLED display substrate in FIG. 3 may be acquired through the above Steps 1 to 13. Subsequently, an organic light-emitting layer and a cathode may be formed on the OLED display substrate. According to the method in the second embodiment of the present disclosure, the PS and the pattern of the pixel definition layer are formed simultaneously through one signal patterning process. To be specific, a dotted box in FIG. 4 illustratively shows the PS 13, so it is unnecessary to coat the organic photosensitive material onto the substrate after the formation of the pattern of the pixel definition layer. As shown in FIG. 5, it is able to prevent the organic photosensitive material from remaining on the anode at the pixel region 15, thereby to improve the yield of the OLED display substrate.

The present disclosure further provides in some embodiments a display device including the above-mentioned OLED display substrate. The display device may be a product or member having a display function, e.g., television, display, digital photo frame, mobile phone or flat-panel computer. The display device may further include a flexible circuit board, a printed circuit board and a back plate.

In the embodiments of the present disclosure, the order of the steps is not limited to the serial numbers thereof. For a person skilled in the art, any change in the order of the steps shall also fall within the scope of the present disclosure if without any creative effort.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other substrate, or an intermediate element may be arranged therebetween.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing an organic light-emitting diode display substrate, comprising:
   coating an organic photosensitive material layer onto a substrate with an anode;
   exposing and developing the organic photosensitive material layer so as to form a post spacer; and
   coating an insulation material layer onto the substrate with the post spacer, and patterning the insulation material layer so as to form a pattern of a pixel definition layer.

2. The method according to claim 1,
   wherein the pattern of the insulation layer comprises a first portion and a second portion protruding from the first portion, the first portion is formed into the pattern of the pixel definition layer, and the second portion is formed into the post spacer.

3. The method according to claim 1, wherein subsequent to forming the pattern of the pixel definition layer, the method further comprises forming an organic light-emitting layer and a cathode sequentially on the substrate with the pattern of the pixel definition layer.

4. The method according to claim 1, wherein a cross section of the post spacer is of a quadrilateral shape.

5. The method according to claim 4, wherein a cross section of the post spacer is of a trapezoidal shape.

6. The method according to claim 5, wherein a cross section of the post spacer is of an isosceles trapezoidal shape.

7. The method according to claim 1, wherein the pattern of the pixel definition layer fully covers the post spacer.

8. The method according to claim 1, wherein the pattern of the pixel definition layer and the post spacer are formed into one piece.

9. The method according to claim 2, wherein a cross section of the first portion is of a rectangular shape.

10. The method according to claim 2, wherein a cross section of the second portion is of a trapezoidal shape.

11. The method according to claim 2, wherein a cross section of the second portion is of an isosceles trapezoidal shape.

12. The method according to claim 1, wherein no organic photosensitive material layer remains at a pixel region corresponding to the anode after the formation of the pattern of the pixel definition layer through patterning the insulation material layer.

* * * * *